United States Patent
Clavette et al.

(10) Patent No.: US 11,075,577 B2
(45) Date of Patent: Jul. 27, 2021

(54) POWER SUPPLY CONTROL AND USE OF GENERATED RAMP SIGNAL

(71) Applicant: Infineon Technologies Austria AG, Villach (AT)

(72) Inventors: Danny Clavette, Greene, RI (US); Kang Peng, East Greenwich, CT (US); Keng Chen, Sudbury, MA (US); Mark A. Crowther, Warwick, RI (US)

(73) Assignee: Infineon Technologies Americas Corp., El Segundo, CA (US)

( * ) Notice: Subject to any disclaimer, the term of this patent is extended or adjusted under 35 U.S.C. 154(b) by 62 days.

(21) Appl. No.: 16/207,477

(22) Filed: Dec. 3, 2018

(65) Prior Publication Data

US 2019/0103811 A1    Apr. 4, 2019

Related U.S. Application Data

(63) Continuation of application No. 15/614,799, filed on Jun. 6, 2017, now abandoned.

(51) Int. Cl.
*H02M 3/156* (2006.01)
*H03K 4/08* (2006.01)
(Continued)

(52) U.S. Cl.
CPC ........... *H02M 3/156* (2013.01); *H02M 1/084* (2013.01); *H02M 3/158* (2013.01); *H03K 4/08* (2013.01);
(Continued)

(58) Field of Classification Search
CPC .. H02M 3/156; H02M 3/1563; H02M 3/1584; H02M 3/155; H02M 3/157;
(Continued)

(56) References Cited

U.S. PATENT DOCUMENTS

| 4,160,981 A | 7/1979 | Raney, Jr. |
| 5,479,090 A * | 12/1995 | Schultz ............ G05F 1/56 323/284 |

(Continued)

FOREIGN PATENT DOCUMENTS

| EP | 0993104 A2 | 4/2000 |
| EP | 2680419 A2 | 1/2014 |

OTHER PUBLICATIONS

Kuang-Yao Cheng, et al., "Characterization and Performance Comparison of Digital V2-Type Constant on-Time Control for Buck Converters", Jun. 1, 2010, pp. 1-6, Control an Modeling for Power Electronics (Compel), 2010 IEEE 12th Workshop on.

(Continued)

*Primary Examiner* — Thienvu V Tran
*Assistant Examiner* — Nusrat Quddus
(74) *Attorney, Agent, or Firm* — Armis IP Law, LLC

(57) ABSTRACT

A power supply includes a reference voltage generator circuit, a ramp generator circuit, and control circuitry. During operation, the reference voltage generator circuit compares a magnitude of a received output voltage feedback signal to a received reference voltage. Based on the comparison, the reference voltage generator circuit produces a varying reference voltage and outputs it to the ramp generator circuit. As its name suggests, a magnitude of the varying reference voltage varies over time. The ramp generator circuit produces a ramp voltage signal, a magnitude of which is offset by the varying reference voltage. To maintain an output voltage of the power supply within regulation, the control circuitry receives the varying reference voltage and controls activation of a power converter circuit to power a load based on a comparison of the ramp voltage signal and the output voltage feedback signal of the power supply.

33 Claims, 10 Drawing Sheets

(51) Int. Cl.
*H02M 1/084* (2006.01)
*H02M 3/158* (2006.01)
*H02M 1/00* (2006.01)

(52) U.S. Cl.
CPC .. *H02M 3/1588* (2013.01); *H02M 2001/0025* (2013.01); *H02M 2003/1586* (2013.01)

(58) Field of Classification Search
CPC ..... H02M 3/33507; H02M 2001/0009; H02M 1/14; H02M 1/143; G05F 1/14; G05F 1/143
See application file for complete search history.

(56) References Cited

U.S. PATENT DOCUMENTS

| | | | | |
|---|---|---|---|---|
| 5,600,234 | A * | 2/1997 | Hastings | G05F 1/575 323/282 |
| 6,066,943 | A * | 5/2000 | Hastings | H02M 3/156 323/285 |
| 6,377,032 | B1 * | 4/2002 | Andruzzi | H02M 3/1588 323/224 |
| 6,912,144 | B1 * | 6/2005 | Clavette | H02M 3/1584 323/283 |
| 6,930,526 | B1 * | 8/2005 | Silva | H02M 3/156 323/274 |
| 7,230,406 | B2 * | 6/2007 | Huang | H02M 3/158 323/222 |
| 7,457,140 | B2 * | 11/2008 | Klein | H02M 3/157 323/225 |
| 7,782,024 | B2 * | 8/2010 | Fukushi | H02M 1/088 323/222 |
| 8,018,208 | B1 * | 9/2011 | Kahn | H02M 3/156 323/224 |
| RE43,414 | E | 5/2012 | Walters | |
| 8,183,848 | B2 | 5/2012 | Kuo | |
| 8,217,636 | B2 * | 7/2012 | Khayat | H02M 3/157 323/282 |
| 8,698,476 | B2 * | 4/2014 | Chen | H02M 3/156 323/288 |
| 8,884,598 | B2 * | 11/2014 | Harrison | H02M 3/156 323/283 |
| 8,896,284 | B2 | 11/2014 | Fan | |
| 9,252,757 | B2 * | 2/2016 | Chao | H03K 4/90 |
| 9,270,176 | B1 | 2/2016 | Nguyen et al. | |
| 9,343,962 | B2 * | 5/2016 | Cheng | H02M 3/156 |
| 9,606,564 | B2 | 3/2017 | Agrawal | |
| 9,712,061 | B1 * | 7/2017 | Newlin | H02M 1/32 |
| 10,020,732 | B2 * | 7/2018 | Arbetter | H02M 3/158 |
| 2002/0125872 | A1 * | 9/2002 | Groom | H02M 3/156 323/288 |
| 2005/0206359 | A1 * | 9/2005 | Daniels | H02M 3/156 323/282 |
| 2005/0248378 | A1 * | 11/2005 | Gibson | H03F 3/217 327/170 |
| 2006/0043955 | A1 * | 3/2006 | Hung | H02M 3/158 323/283 |
| 2007/0103134 | A1 * | 5/2007 | Yang | H02M 3/33523 323/282 |
| 2007/0108954 | A1 * | 5/2007 | Qiu | H02M 3/156 323/284 |
| 2008/0049478 | A1 | 2/2008 | Wong | |
| 2009/0189578 | A1 * | 7/2009 | Chen | H02M 3/1588 323/282 |
| 2009/0206808 | A1 | 8/2009 | Wrathall | |
| 2009/0237059 | A1 * | 9/2009 | Chiba | H02M 3/1588 323/288 |
| 2009/0243580 | A1 * | 10/2009 | Chen | H02M 3/156 323/288 |
| 2009/0302815 | A1 * | 12/2009 | Tanzawa | H02M 3/1584 323/282 |
| 2010/0123446 | A1 * | 5/2010 | Cheng | H02M 3/1588 323/288 |
| 2010/0327836 | A1 * | 12/2010 | Li | H02M 3/1588 323/283 |
| 2011/0316508 | A1 * | 12/2011 | Cheng | H02M 1/14 323/282 |
| 2012/0075891 | A1 * | 3/2012 | Zhang | H02M 3/33523 363/21.18 |
| 2012/0081094 | A1 * | 4/2012 | Luo | H02M 3/156 323/284 |
| 2012/0112721 | A1 * | 5/2012 | Wu | H02M 3/156 323/288 |
| 2012/0313601 | A1 * | 12/2012 | Deguchi | H02M 3/156 323/282 |
| 2012/0313603 | A1 | 12/2012 | Ochoa | |
| 2012/0326688 | A1 | 12/2012 | Sun et al. | |
| 2013/0038301 | A1 | 2/2013 | Ouyang et al. | |
| 2013/0038302 | A1 | 2/2013 | Qian et al. | |
| 2013/0038310 | A1 * | 2/2013 | Menegoli | H02M 3/156 323/288 |
| 2013/0128627 | A1 | 5/2013 | Moon | |
| 2013/0141069 | A1 | 6/2013 | Li | |
| 2013/0187624 | A1 * | 7/2013 | Wakasugi | H02M 3/158 323/282 |
| 2014/0091774 | A1 | 4/2014 | Srinivasan et al. | |
| 2014/0306679 | A1 * | 10/2014 | Tseng | H05B 45/14 323/285 |
| 2014/0327423 | A1 | 11/2014 | Lee et al. | |
| 2014/0361687 | A1 | 12/2014 | Olson | |
| 2015/0077083 | A1 * | 3/2015 | Chen | H02M 3/156 323/288 |
| 2015/0200592 | A1 * | 7/2015 | Chang | H02M 3/156 323/271 |
| 2015/0277460 | A1 * | 10/2015 | Liu | G05F 1/56 323/280 |
| 2015/0311798 | A1 | 10/2015 | Yuan et al. | |
| 2016/0006352 | A1 | 1/2016 | Hang et al. | |
| 2016/0067963 | A1 | 3/2016 | Van Brocklin et al. | |
| 2017/0155315 | A1 | 6/2017 | Yasusaka | |
| 2017/0336818 | A1 * | 11/2017 | Gakhar | G05F 1/575 |

OTHER PUBLICATIONS

Tian Shulin, et al., "Small-signal Mode Analysis and Design of Constant-on-time V2 Control for Low-ESR Caps with External Ramp Compensation" Sep. 17, 2011, pp. 2944-2951, Energy Conversion Congress and Exposition (ECCE), IEEE.
Tian Shulin, et al., "A Three-Terminal Switch Model of Constant On-Time Current Mode with External Ramp Compensation", Oct. 1, 2016, pp. 7311-7319, IEEE Transactions on Power Electronics, vol. 31, No. 10.
Extended European Search Report, EP 18176183.4, dated Oct. 10, 2018, pp. 12.
Office action, EP 18 176 183.4, dated Jan. 3, 2020, pp. 5.
Cheng, et al., "Characterization and Performance Comparison of Digital V2-Type Constant On-Time Control for Buck Converters", Jul. 6, 2010, pp. 1-6, IEEE.
Office Action, EP 18 176 183.4, dated Jan. 12, 2021, pp. 1-7.
SW Lee, "Demystifying Type II and Type III Compensators Using Op-Amp and OTA for DC/DC Converters", Texas Instruments, Application Report, SLVA662, Jul. 31, 2014, pp. 1-16, XP055761962.
Tian, et al. "A Three-Terminal Switch Model of Constant On-Time Current Mode With External Ramp Compensation", Oct. 1, 2016, pp. 1-9, IEEE, Transactions on Power Electronics vol. 31, No. 10.
Tian, et al., "Small-signal Model Analysis and Design of Constant-on-time V2 Control for Low-ESR Caps with External Ramp Compensation", Sep. 17, 2011, pp. 1-8, IEEE.

* cited by examiner

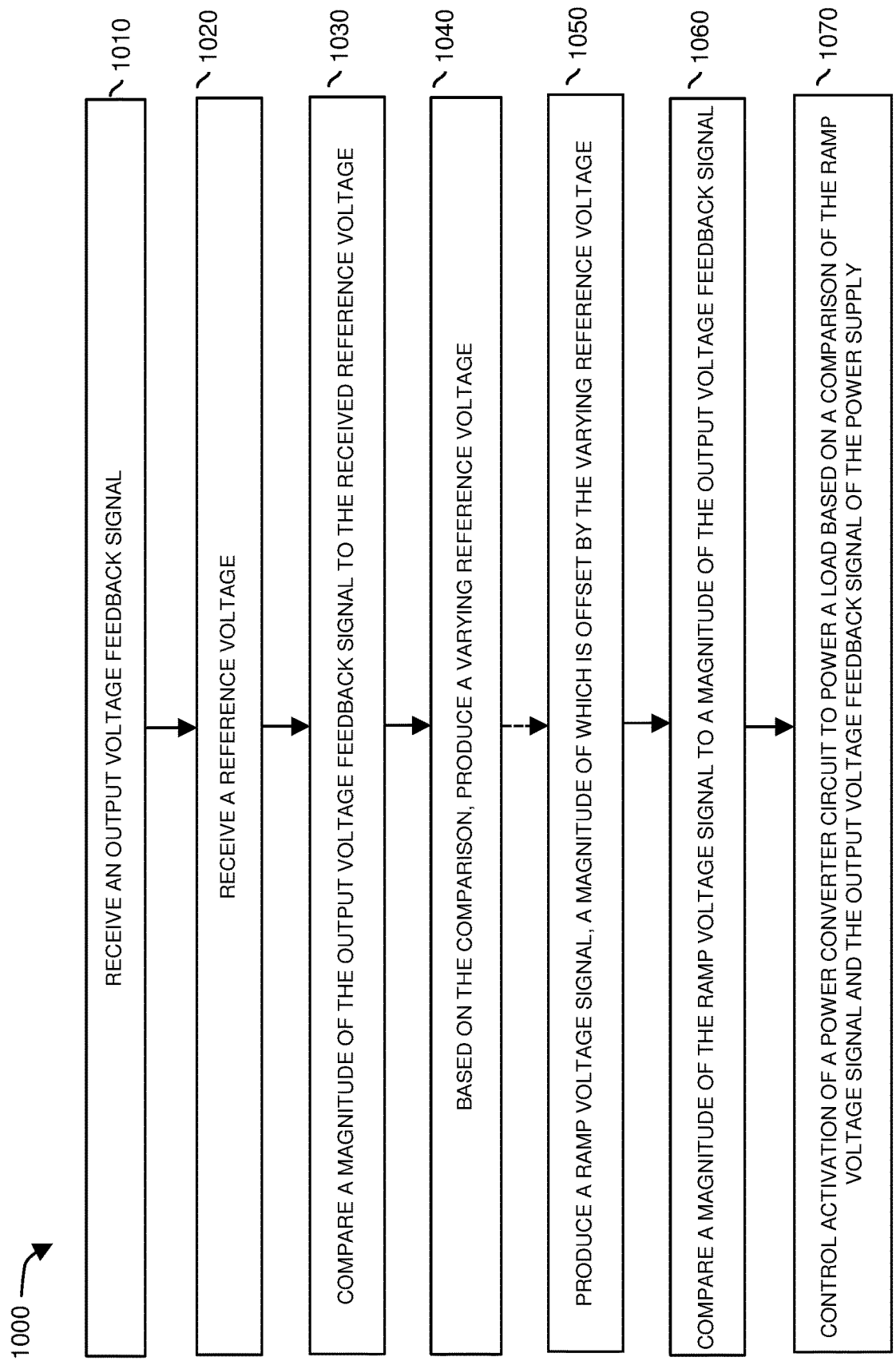

POWER SUPPLY CONTROL AND USE OF GENERATED RAMP SIGNAL

RELATED APPLICATIONS

This application is a continuation of U.S. patent application Ser. No. 15/614,799 entitled "POWER SUPPLY CONTROL AND USE OF GENERATED RAMP SIGNAL," filed on Jun. 6, 2017, the entire teachings of which are incorporated herein by this reference.

BACKGROUND

Conventional multi-phase power supplies may include one or more DC to DC converters to produce a respective output voltage to power a load. Any number of phases in a multi-phase power supply can be operated in parallel to produce the output voltage powering the load.

One type of DC-to-DC converter is a single-stage power converter system. As its name suggests, in the single-stage power converter system, each phase includes a single power converter to convert an input voltage such as 12 V DC (Volts Direct Current) into a respective target output voltage such as 1 volt DC to power a load.

A so-called Constant ON Time (COT) buck switching regulator has fixed pulse-width modulator on-time and uses off-time Pulse Width Modulation (PWM) to regulate an output voltage.

As is well know, the switching mechanism in a switching power supply introduces a ripple voltage in the output voltage feedback sense point due to the equivalent series resistance (ESR) in a respective output capacitor. The output voltage of buck regulator is regulated based on the ripple in the output and feedback voltage. In many applications, it is desirable to minimize the ripple in the output voltage. However, this can result in too little ripple amplitude to achieve jitter free PWM. Jitter reduces efficiency and can lead to system instability.

In certain conventional power supply systems, an artificial ramp is used to compensate for low ripple solutions.

BRIEF DESCRIPTION

One solution to the technical problem described above is measuring the inductor ripple current and adding it to a feedback voltage to mimic the output voltage ripple. To accomplish this, an RC (Resistor-Capacitor) filter can be connected across the inductor. The drawbacks of this approach are that: 1) the inductor series resistance must be relatively constant; 2) extra components are required, which adds complexity and cost of a respective voltage regulator.

In contrast to conventional approaches, embodiments herein include novel ways of providing more accurate voltage regulation, higher conversion efficiency, reduced, jitter, etc.

More specifically, embodiments herein include a reference voltage generator circuit, a ramp generator circuit, and power supply control circuitry.

During operation, the reference voltage generator circuit receives an output voltage feedback signal and a reference voltage. The reference voltage generator circuit compares a magnitude of the output voltage feedback signal to the received reference voltage. Based on the comparison, the reference voltage generator circuit produces a varying reference voltage (variable offset voltage) and outputs it to the ramp generator circuit. As its name suggests, a magnitude of the varying reference voltage varies over time.

The ramp generator circuit produces a ramp voltage signal, a magnitude of which is offset by a magnitude of the varying reference voltage. In one embodiment, the varying reference voltage is a floor voltage to which the ramp voltage signal is added. The ramp voltage signal is therefore offset with respect to the floor voltage.

To maintain the output voltage within regulation, the control circuitry receives the varying reference voltage and controls activation of a power converter circuit to power a load based on a comparison of the ramp voltage signal (offset by varying reference voltage) and the output voltage feedback signal of the power supply.

In accordance with further embodiments, the output voltage feedback signal represents an output voltage (or a derivative of the output voltage) produced by the power converter circuit to power the load. For example, the reference voltage generator circuit (or other suitable circuit) associated with the power supply can be configured to derive the output voltage feedback signal from the respective output voltage generated by the power converter circuit. The output voltage feedback signal can be any desired ratio of the actual output voltage such as produced by a voltage divider or other suitable circuit.

In one embodiment, the ramp voltage signal emulates a ripple voltage present on an output voltage generated by the power converter circuit to power the load. The control circuitry compares the ramp voltage signal to the output voltage feedback signal to determine timing of activating a high side switch in the power converter circuit to an ON state.

By way of non-limiting example embodiment, the power converter circuit can be operated in a constant ON-time control mode in which the PWM setting of the ON-time is constant and the off time varies depending upon results of comparing the ramp voltage signal to the output voltage feedback signal.

In accordance with still further embodiments, in response to detecting a condition in which the ramp voltage signal crosses (is approximately greater than or equal to) the output voltage feedback signal, the control circuitry can be configured to further perform any of one or more operations including: i) in accordance with a constant ON time, activating high side switch circuitry in the power converter circuit for a predetermined amount of time to increase a magnitude of the output voltage, ii) resetting a magnitude of the ramp voltage, etc.

In one embodiment, resetting of the ramp voltage signal resets the magnitude of the ramp voltage signal to be substantially equal to a current magnitude of the varying reference voltage at the time of resetting. Subsequent to the resetting, the ramp generator circuit ramps the ramp voltage signal again. Accordingly, the ramp generator circuit repeatedly ramps the ramp voltage signal over time.

As previously discussed, a magnitude of the varying reference voltage varies over time. In one embodiment, the reference voltage generator circuit increases a magnitude of the varying reference voltage in response to a transient condition in which the load increases a rate of current consumption. Conversely, the reference voltage generator circuit decreases a magnitude of the varying reference voltage in response to a transient condition in which the load decreases a rate of current consumption.

In yet further embodiments, the reference voltage generator circuit includes a bias circuit. As its name suggests, the bias circuit biases the varying reference voltage towards a bias voltage value over time. The reference voltage generator circuit varies a magnitude of the varying reference voltage (offset voltage) with respect to the bias voltage value depending on a difference between the output voltage feedback signal and a reference voltage setpoint.

In accordance with further embodiments, the reference voltage generator circuit includes a transconductance amplifier. The transconductance amplifier compares a magnitude of the output voltage feedback signal to a received reference voltage. Based on the comparison, the transconductance amplifier generates an output current, a magnitude of which depends on a difference between the magnitude of the output voltage feedback signal and the received reference voltage.

In one embodiment, the reference voltage generator circuit further includes a capacitor to receive the output current generated by the transconductance amplifier. The reference voltage generator circuit further includes a bias circuit to produce a bias current. The bias circuit applies the bias current to the capacitor to bias the varying offset voltage towards a predetermined bias voltage value. The varying reference voltage outputted by the capacitor varies depending upon a combination of the output current of the transconductance amplifier and the bias current.

These and other more specific embodiments are disclosed in more detail below.

Note that techniques as discussed herein can be implemented in any suitable environment such as multi-phase power supply applications, single phase point of load (a.k.a., POL) power supply applications, etc.

Additionally, note that embodiments herein can be used to improve phase current balance in multiphase systems resulting in higher conversion efficiency and reduced jitter. Use of a single artificial ramp generator for many phases reduces mismatch between phases.

Embodiments herein simplify IC (Integrated Circuit) complexity while achieving optimal setpoint voltage regulation accuracy. Reduced trimming requirements and design for thermal/voltage/process variation can be simplified resulting in overall IC die area savings and test complexity.

Further embodiments herein simplify a respective buck regulator solution since no extra external components or specific PCB (Perforated Circuit Board) layout requirements are required. Introducing the error reduction loop in the present invention can achieve very good DC (Direct Current) accuracy while maintaining very fast load transient response.

Additionally for multiphase control ICs, utilization of a single artificial ramp PWM generation control algorithm, mismatch errors between phases can be eliminated to improve natural current sharing.

Note further that although embodiments as discussed herein are applicable to multi-phase power supply circuits such as those implementing buck converters, DC-DC converter phases, the concepts disclosed herein may be advantageously applied to any other suitable topologies as well as general power supply control applications.

Note further that embodiments herein can include computer processor hardware (that executes corresponding switch instructions) to carry out and/or support any or all of the method operations disclosed herein. In other words, one or more computerized devices or processors (computer processor hardware) can be programmed and/or configured to operate as explained herein to carry out different embodiments of the invention.

Yet other embodiments herein include software programs to perform the steps and operations summarized above and disclosed in detail below. One such embodiment comprises a computer program product that has non-transitory computer-storage media (e.g., memory, disk, flash, . . . ) including computer program logic encoded thereon that, when performed in a computerized device having a processor and corresponding memory, programs the processor to perform any of the operations disclosed herein. Such arrangements are typically provided as software instructions, code, and/or other data (e.g., data structures) arranged or encoded on a computer readable storage medium or non-transitory computer readable media such as an optical medium (e.g., CD-ROM), floppy or hard disk or other a medium such as firmware or microcode in one or more ROM or RAM or PROM chips, an Application Specific Integrated Circuit (ASIC), etc. The software or firmware or other such configurations can be installed onto a controller to cause the controller to perform the techniques explained herein.

Accordingly, one particular embodiment of the present disclosure is directed to a computer program product that includes a computer readable medium having instructions stored thereon for supporting operations such as controlling one or more phases in a power supply. For example, in one embodiment, the instructions, when carried out by computer processor hardware (one or more computer devices), cause the computer processor hardware to: receive an output voltage feedback signal; receive a reference voltage; compare a magnitude of the output voltage feedback signal to the received reference voltage; based on the comparison, produce a varying reference voltage; produce a ramp voltage signal, a magnitude of which is offset by the varying reference voltage; and control activation of a power converter circuit to power a load based on a comparison of the ramp voltage signal and the output voltage feedback signal of the power supply.

The ordering of the steps has been added for clarity sake. These steps can be performed in any suitable order.

It is to be understood that the system, method, device, apparatus, etc., as discussed herein can be embodied strictly as hardware, as a hybrid of software and hardware, or as software alone such as within a processor, or within an operating system or a within a software application.

Note that although each of the different features, techniques, configurations, etc., herein may be discussed in different places of this disclosure, it is intended, where appropriate, that each of the concepts can optionally be executed independently of each other or in combination with each other. Accordingly, the one or more present inventions as described herein can be embodied and viewed in many different ways.

Also, note that this preliminary discussion of embodiments herein purposefully does not specify every embodiment and/or incrementally novel aspect of the present disclosure or claimed invention(s). Instead, this brief description only presents general embodiments and corresponding points of novelty over conventional techniques. For additional details and/or possible perspectives (permutations) of the invention(s), the reader is directed to the Detailed Description section and corresponding figures of the present disclosure as further discussed below.

BRIEF DESCRIPTION OF THE DRAWINGS

The foregoing and other objects, features, and advantages of the invention will be apparent from the following more particular description of preferred embodiments herein, as illustrated in the accompanying drawings in which like reference characters refer to the same parts throughout the different views. The drawings are not necessarily to scale, with emphasis instead being placed upon illustrating the embodiments, principles, concepts, etc.

FIG. 10 is an example diagram illustrating a method according to embodiments herein.

DETAILED DESCRIPTION

In accordance with embodiments herein, a power supply includes a reference voltage generator circuit, a ramp generator circuit, and control circuitry. During operation, the reference voltage generator circuit compares a magnitude of a received output voltage feedback signal to a received reference voltage. Based on the comparison, the reference voltage generator circuit produces a varying reference voltage and outputs it to the ramp generator circuit. As its name suggests, a magnitude of the varying reference voltage varies over time. The ramp generator circuit produces a ramp voltage signal, a magnitude of which is offset by the varying reference voltage. In one embodiment, the varying reference voltage is a ground reference to which the ramp generator circuit is referenced.

The ramp generator circuit generates a ramp signal offset by the varying reference voltage. To maintain an output voltage of the power supply within regulation, control circuitry compares the offset reference signal generated by the ramp generator circuit and an output voltage feedback signal of the power supply to control activation of a power converter circuit that powers a load.

Figure 1:
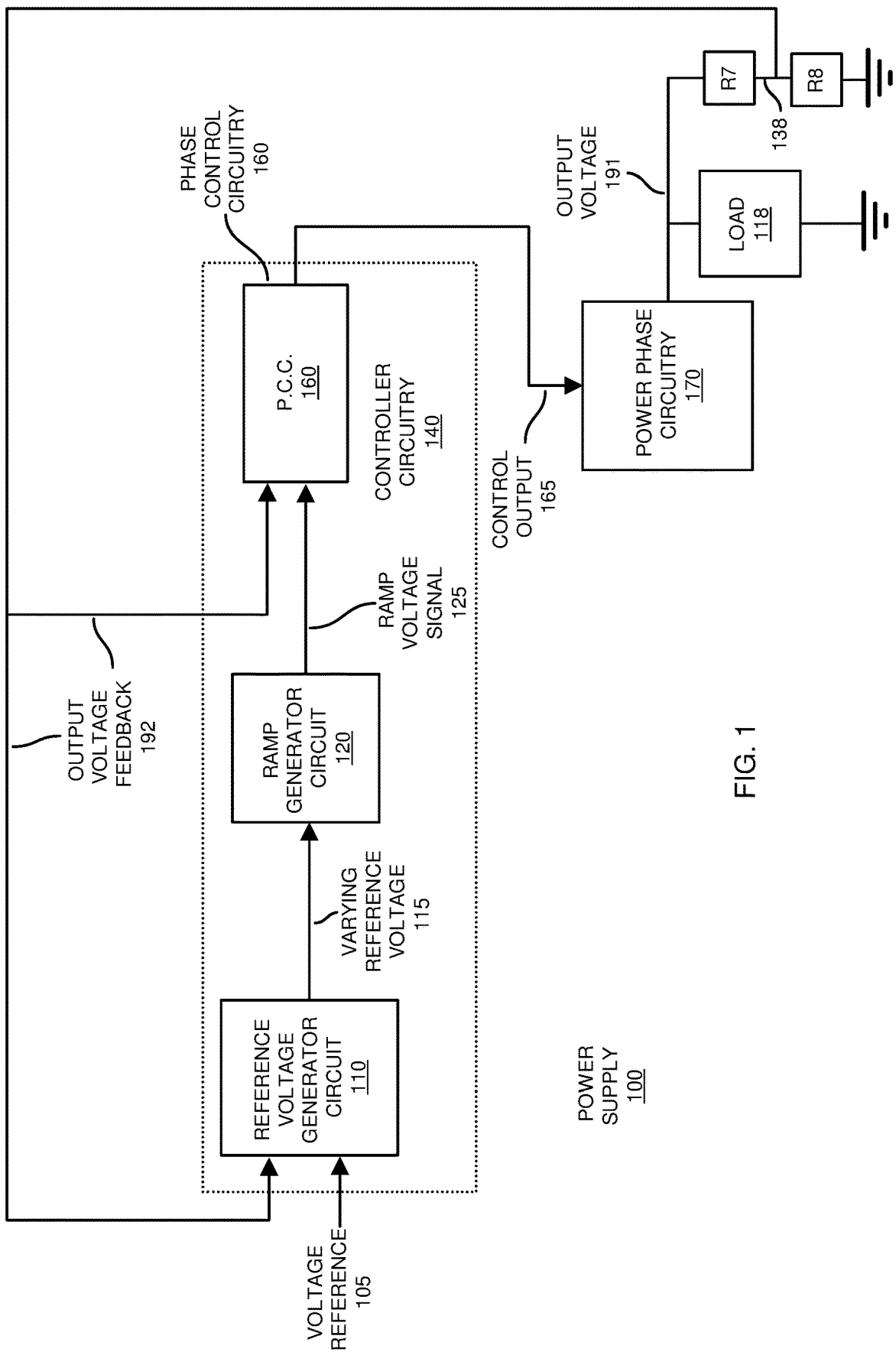
FIG. 1 is an example diagram illustrating a power supply according to embodiments herein.

Now, more specifically, FIG. 1 is an example diagram of a power converter phase and respective circuitry according to embodiments herein.

As shown, embodiments herein include a reference voltage generator circuit 110, a ramp generator circuit 120, and phase control circuitry 160.

In general, during operation, the reference voltage generator circuit 110 receives an output voltage feedback signal 192 and a reference voltage 105 (such as a voltage setpoint). In one embodiment, the output voltage feedback signal 192 is a ratio metric value, namely [R7/(R7+R8)] *output voltage 191, derived from the output voltage 191. Output voltage 191 powers the load 118.

Note that the resistor values R7 and R8 can be any suitable values depending on the embodiment.

A difference in magnitude of the output voltage feedback signal 192 with respect to the reference voltage 105 indicates a degree to which the respective output voltage 191 of the power supply 100 is within regulation.

Further, during operation, the reference voltage generator circuit 110 compares a magnitude of the output voltage feedback signal 192 to the received reference voltage 105. Based on the comparison, the reference voltage generator circuit 110 produces a varying reference voltage 115 (variable offset voltage) and outputs it to the ramp generator circuit 120.

As previously indicated, a magnitude of the varying reference voltage 115 varies over time depending upon load conditions.

The ramp generator circuit 120 produces a ramp voltage signal 125, a magnitude of which is offset by the varying reference voltage 115. In one embodiment, the varying reference voltage 150 serves as a varying ground voltage reference (or floor voltage) for the ramp generator circuit 120. In such an instance, the ramp generator circuit 120 produces a respective ramp voltage signal 125 that is offset by the varying reference voltage 115 with respect to the floor or ground voltage.

To maintain the output voltage 191 within regulation, the phase control circuitry 160 compares the output voltage feedback 192 to the ramp voltage signal 125. Based on the comparison, the phase control circuitry 160 produces the control output 165. As further discussed below, the control output 165 (such as one or more control signals) is used as a basis to control power phase circuitry 170 (such as a one or more phases of power supply 100).

As further shown, the power supply phase circuitry 170 produces the output voltage 191 to power the respective load 118 based upon the received control output 165.

As previously discussed, the power supply 100 further includes voltage divider circuit including resistor R7 and resistor R8. In one embodiment, the center tap node 138 of the voltage divider circuit outputs the output voltage feedback 192, which is used as a basis in which to generate the varying reference voltage 115 and the control output 165 as previously discussed.

Accordingly, the output voltage feedback signal 192 can represent the output voltage 191 itself (such as when the ratio=1) or a ratio (R8/[R7+R8]) of the output voltage 191.

Note that, in one embodiment, the ramp voltage signal 125 emulates a ripple voltage present on an output voltage 191 powering the load 118.

As further discussed below, in one embodiment, the phase control circuitry 160 compares the offset-adjusted ramp voltage signal 125 to the output voltage feedback signal 192 to determine timing of activating high side switch circuitry of a respective phase in the phase circuitry 170 to an ON state.

Note further that the power supply 100 can be operated in a constant ON-time control mode in which the PWM (Pulse Width Modulation) setting of the ON-time of control pulses is constant and the off time is varied depending upon the comparison of the ramp voltage signal to the output voltage feedback signal. More specifically, the phase circuitry 170 can be configured to operate in a so-called constant ON-time mode in which the ON-time of activating the high side switch circuitry is a fixed or predetermined value while a frequency of activating the high side switch circuitry is adjusted to regulate the output voltage 191 to a desired set point. This is also discussed in more detail below.

Figure 2:
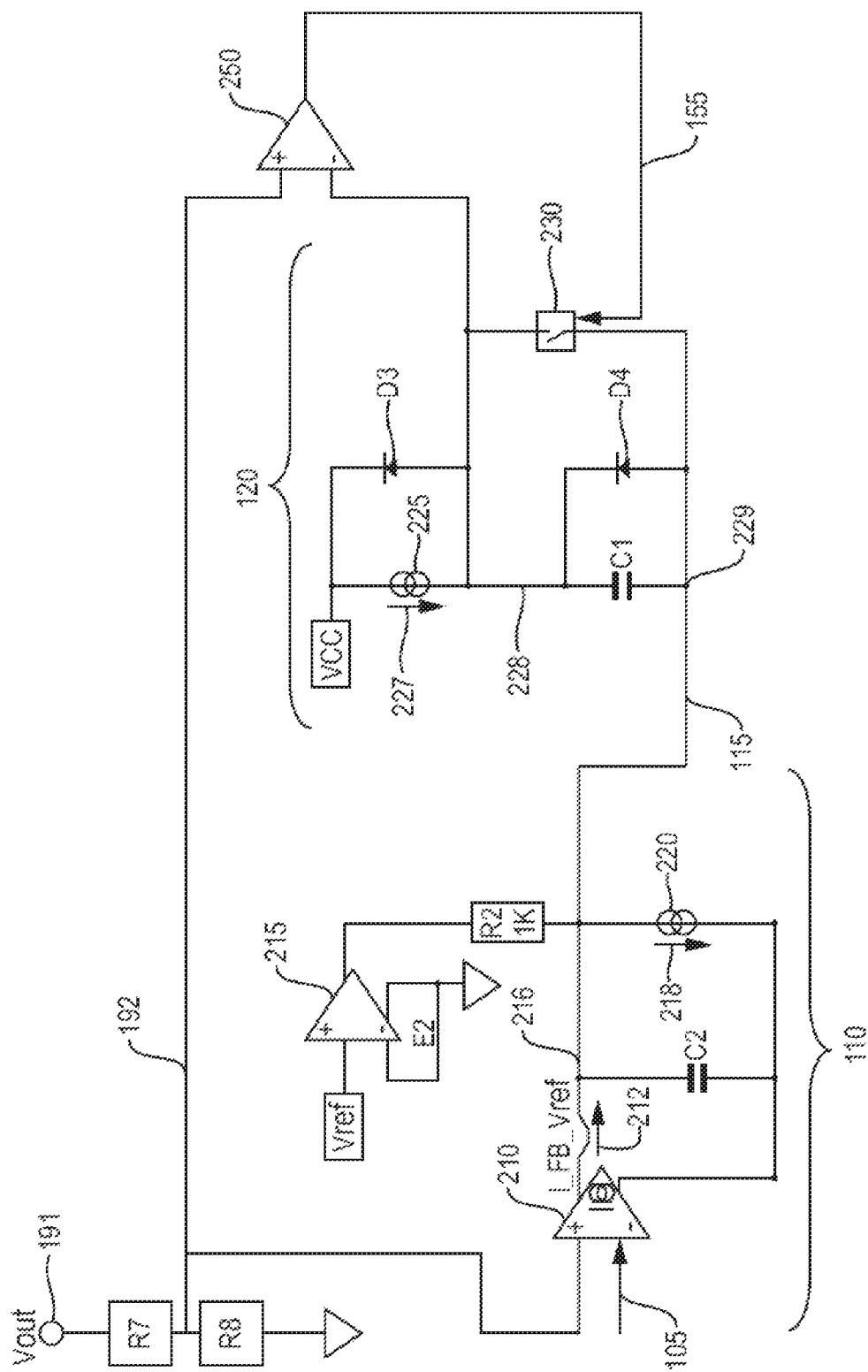
FIG. 2 is an example diagram illustrating control circuitry according to embodiments herein.

FIG. 2 is an example diagram illustrating control circuitry according to embodiments herein.

As further shown in FIG. 2, the reference voltage generator circuit 110 can be configured to include a transconductance amplifier 210. The reference voltage 105 is inputted to the inverting input of the transconductance amplifier 210. The output voltage feedback signal 192 outputted from the voltage divider R7 and R8 is inputted into the non-inverting input of the transconductance amplifier 210.

During operation, the transconductance amplifier 210 compares a magnitude of the output voltage feedback signal 192 to a received reference voltage 105. Based on the comparison, the transconductance amplifier 210 generates an output current signal 212, a magnitude of which depends on a difference between the magnitude of the output voltage feedback signal 192 and the received reference voltage 105. For example, if the difference is equal to zero, the transconductance amplifier outputs the current signal 212 of 0.0 uAmps. For larger than zero voltage differences between the respective inverting and non-inverting input of the transconductance amplifier 210, the transconductance amplifier 210 outputs a corresponding higher magnitude of current.

In accordance with further embodiments, the reference voltage generator circuit 110 further includes a capacitor C2 to receive the output current signal 212 generated by the transconductance amplifier 210. The reference voltage generator circuit 110 further includes a bias circuit (such as resistor R2 and current source 220) to produce a bias current 218. As its name suggests, the bias circuit biases a magnitude of the varying reference voltage 115 towards a predetermined bias voltage value over time. As further discussed herein, the reference voltage generator circuit 110 varies a magnitude of the varying reference voltage 115 (offset voltage) with respect to the predetermined bias voltage value depending on a difference between the output voltage feedback signal 192 and the magnitude of the reference voltage 105.

Further in this example, the bias circuit applies the bias current 218 to node 216 of the capacitor C2 to bias the varying offset voltage 115 towards a predetermined bias voltage value. The varying reference voltage 115 outputted by the capacitor C2 varies depending upon a combination of the output current signal 212 of the transconductance amplifier 210 and the bias current 218.

In this example embodiment, for sake of illustration only, assume that the unity gain buffer 215 outputs a voltage of 500 mV to the resistor R2 (such as 1000 ohms). Assuming that the bias current 218 is 55 µAmps, this produces 55 mV across the resistor R2. Accordingly, the steady-state voltage of capacitor C2 is 445 mVDC. In other words, the varying reference voltage 114 is biased to 445 mVDC in this example. This represents the magnitude of the variable reference voltage 115 during steady-state conditions in which there is no difference between the output voltage feedback signal 192 and the reference voltage 105.

As a further illustrative example, assume that the power supply 100 is configured to produce the output voltage 191 to be 1.0 VDC. Assume further that the value of resistor R7 is 1000 ohms and the value of resistor R8 is 1000 ohms. In such an instance, the output voltage feedback signal 192 generally will be 0.5 V DC during steady-state conditions.

As a further illustrative example, assume that the reference voltage 105 is 500 mV DC. Transconductance amplifier 210 produces the output current signal 212 depending upon a difference between the reference voltage 105 and the magnitude of the output voltage feedback signal 192. In one embodiment, the transconductance amplifier 210 generates an output current of 800 µAmps per each volt difference across its inverting and inverting inputs.

Accordingly, the reference voltage generator circuit 110 produces a variable reference voltage 115 that is generally equal to a setpoint value such as 445 mV. However, this voltage varies depending upon the amount of current produced by the transconductance amplifier 210 feeding into the capacitor C2. In other words, variations in the magnitude of the output voltage feedback signal 192 with respect to the reference voltage 105, such as caused by transient increases or decreases in currents consumption by the load 118, cause the magnitude of the variable reference voltage 115 to fluctuate around setpoint value of 445 mV.

Thus, a magnitude of the varying reference voltage 115 varies over time depending on load conditions. For example, the reference voltage generator circuit 110 increases a magnitude of the varying reference voltage 115 in response to a transient condition in which the load 118 increases a rate of current consumption. Conversely, the reference voltage generator circuit 110 decreases a magnitude of the varying reference voltage 105 in response to a transient condition in which the load 118 decreases a rate of current consumption.

As previously mentioned, any of the parameters (such as transconductance amplifier settings, reference voltage magnitude, R7/R8 ratio settings, etc.,) can be adjusted to different values depending upon the application.

Further, as previously discussed, note that the controller circuitry 140 includes a ramp generator circuit 120. In this example embodiment, the ramp generator circuit 120 includes compare circuitry 250, current source 225, diode D3, capacitor C1, diode D4, and switch 230.

During operation, the current source 225 outputs current 227 (such as a fixed or constant current) to node 228 of the capacitor C1. This causes charging of the capacitor C1 and the magnitude of the ramp voltage signal 125 (such as an emulated ripple voltage) to increase. Note that the node 229 of the capacitor C1 is referenced with respect to the variable reference voltage 115. Accordingly, the ramp voltage signal 125 is offset with respect to the variable reference voltage 115.

The compare circuitry 250 compares the magnitude of the ramp voltage signal 125 to the output voltage feedback signal 192. In response to detecting a condition in which a magnitude of the ramp voltage signal 125 crosses a magnitude of the output voltage feedback signal 192, the compare circuitry 250 produces the compare control signal 155 to activate the switch 230 to an ON state, discharging the voltage across the capacitor C1, resulting in resetting of the magnitude of the ramp voltage signal 125 down to the magnitude of the variable reference voltage 115. In other words, resetting of the ramp voltage signal the activation of the switch 230 resets the magnitude of the ramp voltage signal 125 to be substantially equal to a magnitude of the varying reference voltage 115 due to the discharge of the charge stored on the capacitor C1.

Subsequent to this reset condition, the ramp generator circuit 120 ramps the ramp voltage signal 125 again. Accordingly, the ramp generator circuit 120 repeatedly ramps the ramp voltage signal 125 over time.

As further discussed below, in addition to resetting the ramp voltage signal 125 in response to detecting the crossing condition, the control circuitry 140 can be configured to perform the additional operation of activating (for a constant ON-time) appropriate high side switch circuitry in a respective phase of the phase circuitry 170.

Figure 3:
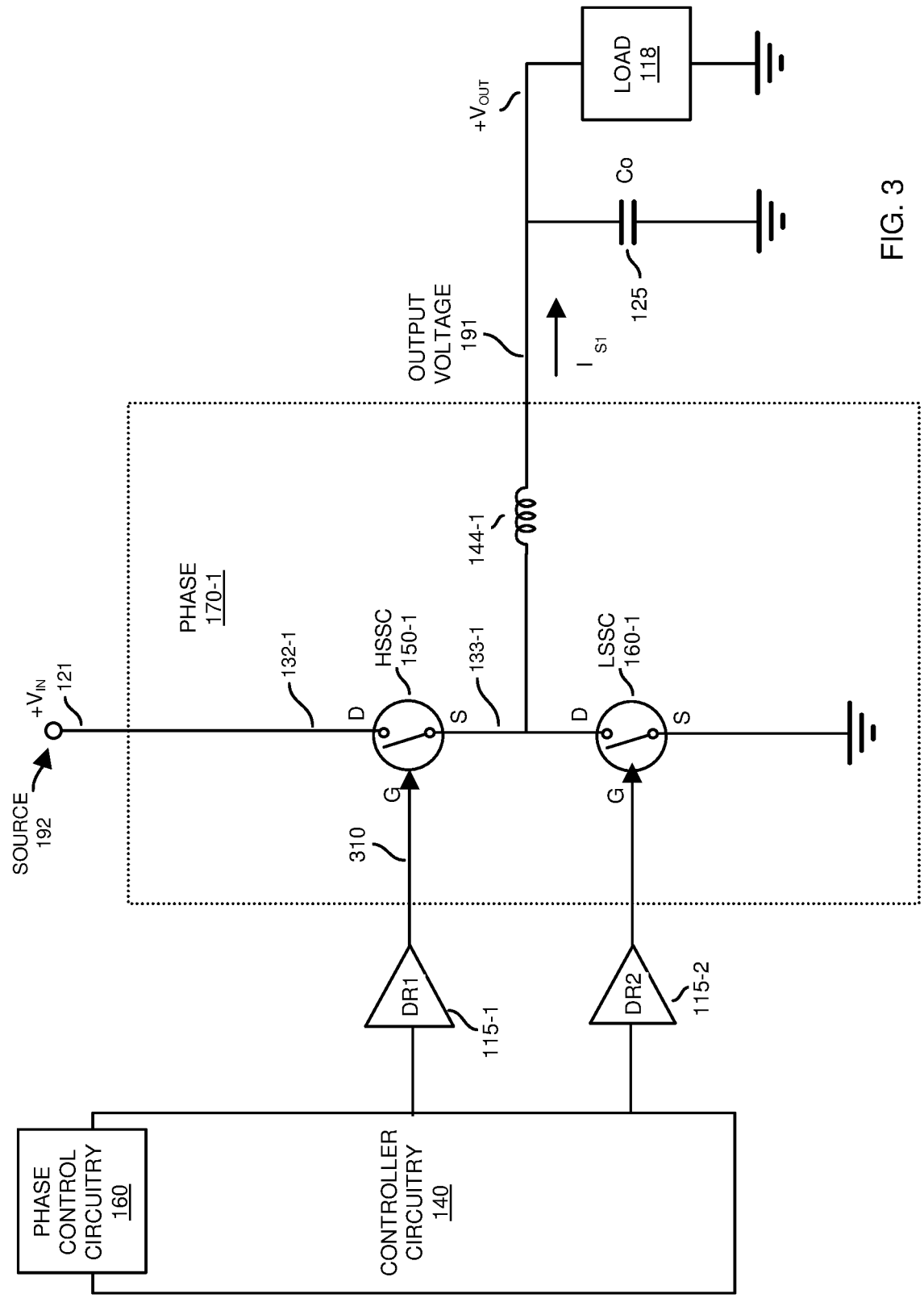
FIG. 3 is an example diagram illustrating a power converter circuit (such as one phase) according to embodiments herein.

FIG. 3 is an example diagram illustrating a power converter circuit (such as one phase) according to embodiments herein.

As shown, power supply phase 170-1 is a single phase in power supply 100. The phase 170-1 includes control circuitry 140, phase control circuitry 160, driver circuitry 115-1, driver circuitry 115-2, high side switch circuitry 150-1, low side switch circuitry 160-1, and inductor 144-1.

In one embodiment, each of the high side switch circuitry 150-1 and low side switch circuitry 160-1 are power MOSFET (Metal Oxide Semiconductor Field Effect Transistor) devices. If desired, each of these three circuits can be similar or same in design in which the devices have similar or same attributes. However, note that switch circuitry (such as high side switch circuitry 150-1, and low side switch circuitry 160-1) can be any suitable type of switch resource (field effect transistors, bipolar junction transistors, etc.).

Appropriate switching of the high side switch circuitry 150-1 and the low side switch circuitry 160-1 results in generation of the output voltage 191 as is known in a conventional DC-DC buck converter. In other words, the control circuitry 140 controls the driver circuitry 115-1 to produce the control signal PWM control signal 310 (PWM1) to control high side switch circuitry 150-1. In general, the low side switch circuitry 160-1 is activated when the high side switch circuitry 150-1 is deactivated. Conversely, the low side switch circuitry 160-1 is deactivated when the high side switch circuitry 170-1 is activated.

Additional details of controlling the high side switch circuitry 150-1 and the low side switch circuitry 160-2 are further discussed below with respect to FIGS. 4 and 5.

Figure 4:
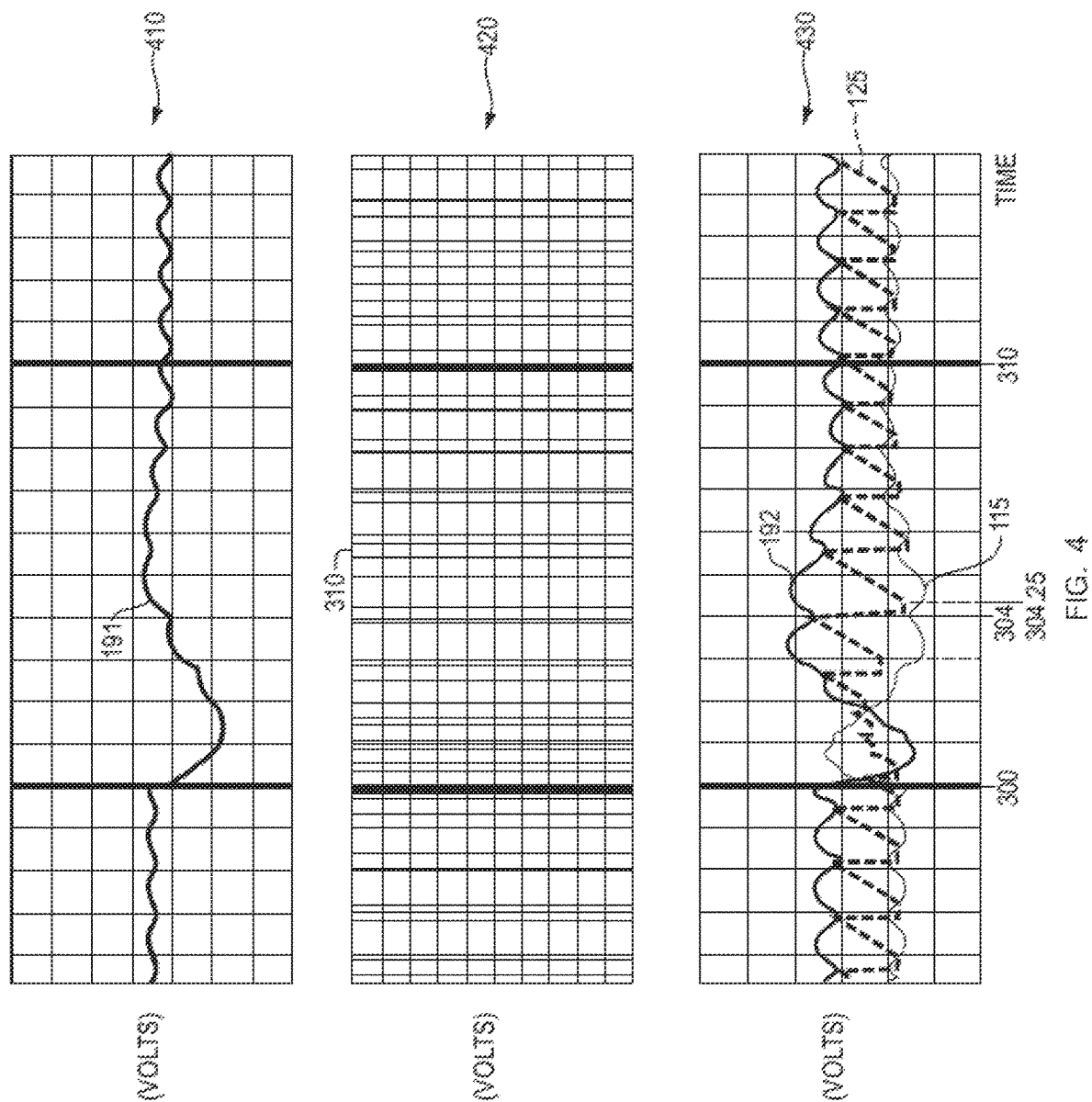
FIG. 4 is an example timing diagram illustrating a circuit response based on a transient increase in current consumption according to embodiments herein.

FIG. 4 is an example timing diagram illustrating a circuit response based on a transient increase in current consumption according to embodiments herein.

As shown, graph 410 illustrates a magnitude of the output voltage 191 and how it varies over time. At around time T=300, the load 118 experiences a transient increase in current consumption, causing a magnitude of the output voltage 191 to slightly dip.

Graph 420 illustrates generation of PWM control signal 310 (outputted from driver circuitry 115-1 in FIG. 3) based upon a comparison of the ramp voltage signal 125 with respect to the output voltage feedback signal 192.

Graph 430 illustrates operation of the control circuitry 140 including the comparison of the ramp voltage signal 125 with respect to the output voltage feedback signal 192. As previously discussed, the reference voltage generator circuit 110 produces the varying reference voltage 115. Ramp generator circuit 120 produces the ramp voltage signal 125 with respect to the variable reference voltage 115.

As an illustration of operation, at time T=304, the phase control circuitry 160 detects that the reference voltage signal 125 crosses the output voltage feedback signal 192. In response to such a condition, the phase control circuitry 160 resets the magnitude of the ramp voltage signal 125 back to the voltage reference voltage 115. Additionally, the phase control circuitry 160 activates the high side switch circuitry 150-1 for a predetermined amount of time in accordance with the constant high side ON-time setting.

More specifically, subsequent to activating the high side switch circuitry 150-1 for the predetermined amount of time (hi side ON-time of duration 0.25), the phase control circuitry 160 deactivates the high side switch circuitry 150-1 (such as at T=304.25) and allows the ramp voltage signal 125 to ramp up again.

Each time the ramp voltage signal 125 crosses the output voltage feedback signal 192, the phase control circuitry 160 repeats this process of resetting the ramp voltage signal 125 and activating respective high side switch circuitry 150-1.

In one embodiment, as further shown in FIG. 4, the phase control circuitry 160 does not start ramping a magnitude of the ramp voltage signal 125 again until after the respective high side switch circuitry 150-1 is activated for the selected constant ON-time.

Accordingly, variations in a magnitude of the varying reference voltage 115 (which acts as a floor, offset, or reference voltage for the generated ramp signal) affects the frequency of generating the ON-time pulses for the high side switch circuitry 150-1. As shown in FIG. 4, between time 300 and 304, the phase control circuitry 160 activates the high side switch circuitry 150-1 at a higher rate to accommodate the transient load condition of consuming more current.

Figure 5:
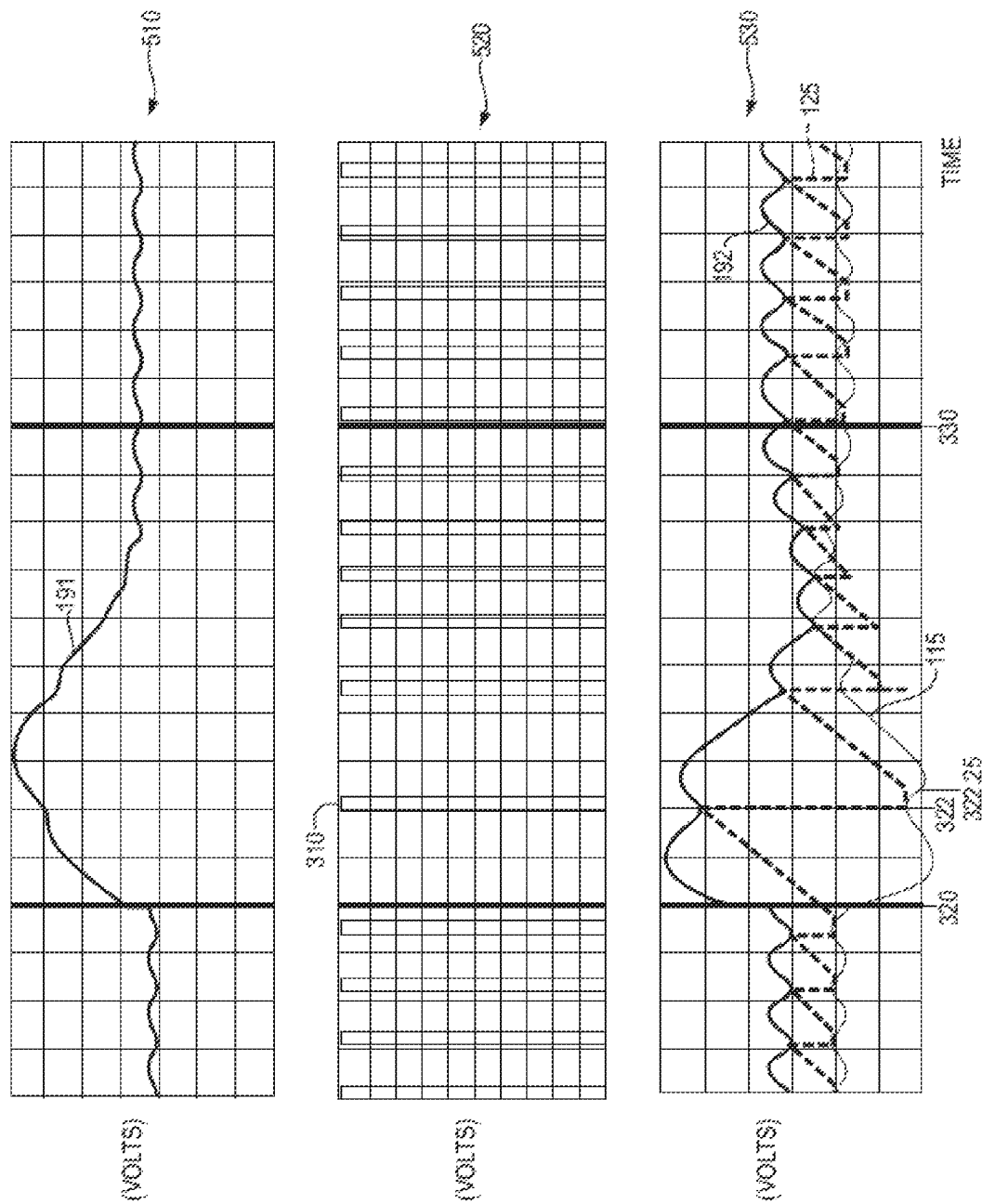
FIG. 5 is an example timing diagram illustrating a circuit response based on a transient decrease in current consumption according to embodiments herein.

FIG. 5 is an example timing diagram illustrating a circuit response based on a transient decrease in current consumption according to embodiments herein.

As shown, graph 510 illustrates a magnitude of the output voltage 191 and how it varies over time. At around time T=320, the load 118 experiences a transient decrease in current consumption, causing a magnitude of the output voltage 191 to increase.

Graph 520 illustrates generation of PWM control signal 310 (outputted from driver circuitry 115-1 in FIG. 3) based upon a comparison of the ramp voltage signal 125 with respect to the output voltage feedback signal 192.

Graph 530 illustrates operation of the control circuitry 140 including the comparison of the ramp voltage signal 125 with respect to the output voltage feedback signal 192. As previously discussed, the reference voltage generator circuit 110 produces the varying reference voltage 115. Ramp generator circuit 120 produces the ramp voltage signal 125 with respect to the variable reference voltage 115.

At time T=322, the phase control circuitry 160 detects that the reference voltage signal 125 crosses (is equal to or greater than) the output voltage feedback signal 192. In response to such a condition, the phase control circuitry 160 resets the magnitude of the ramp voltage signal 125 back to the voltage reference voltage 115. Additionally, the phase control circuitry 160 activates the high side switch circuitry 150-1 at time 322 for a predetermined amount of time (duration of 0.25) in accordance with the constant high side ON-time setting.

Subsequent to activating the high side switch circuitry 150-1 for the predetermined amount of time (hi side ON-time of duration 0.25), the phase control circuitry 160 deactivates the high side switch circuitry 150-1 (such as at T=322.25) and allows the ramp voltage signal 125 to ramp up again. Each time the ramp voltage signal 125 crosses the output voltage feedback signal 192, the phase control circuitry 160 repeats this process of resetting the ramp voltage signal 125 and activating respective high side switch circuitry 150-1 for a fixed amount time.

In one embodiment, as previously discussed, the control circuitry 140 controls the low side switch circuitry 160-1 to be set to an OFF state when the high side switch circuitry 150-1 is in an ON state.

In one embodiment, as further shown in FIG. 5, the phase control circuitry 160 does not start ramping a magnitude of the ramp voltage signal 125 again until after the respective high side switch circuitry 150-1 is activated for the selected constant ON-time.

Accordingly, variations in a magnitude of the varying reference voltage 115 (which acts as a floor, offset, or reference voltage for the generated ramp signal) affects the frequency of generating the ON-time pulses for the high side switch circuitry 150-1. As shown in FIG. 5 between time 320 and 326, the phase control circuitry 160 activates the high side switch circuitry 150-1 at a lower rate to accommodate the transient load condition of consuming less current.

Figure 6:
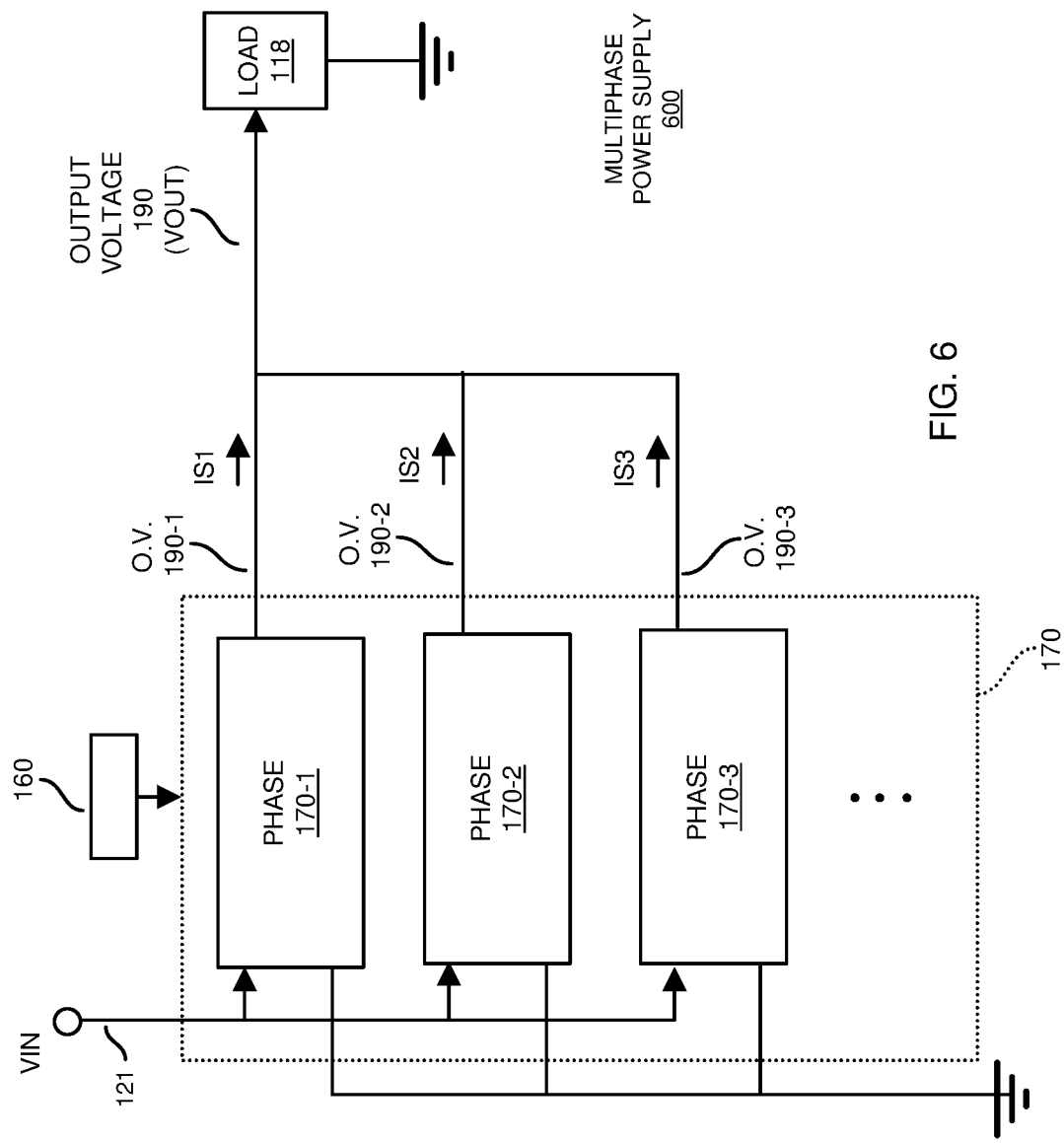
FIG. 6 is an example diagram illustrating use of control circuitry to control multiple phases according to embodiments herein.

FIG. 6 is an example diagram illustrating use of control circuitry to control multiple phases according to embodiments herein.

As shown, phase circuitry 170 of the multiphase power supply 600 includes phase 170-1, phase 170-2, phase 170-3, etc. Each of the phases contributes to supplying current to the load 118.

In a similar manner as previously discussed, the controller circuitry 140 operates in a constant ON-time operational mode. However, in this instance, the controller circuitry 140 controls operation of multiple phases including 170-1, 170-2, 170-3, etc. Each of the phases 170-1, 170-2, 173, etc., is configured in a similar manner as the single phase as shown in FIG. 3.

Figure 7:
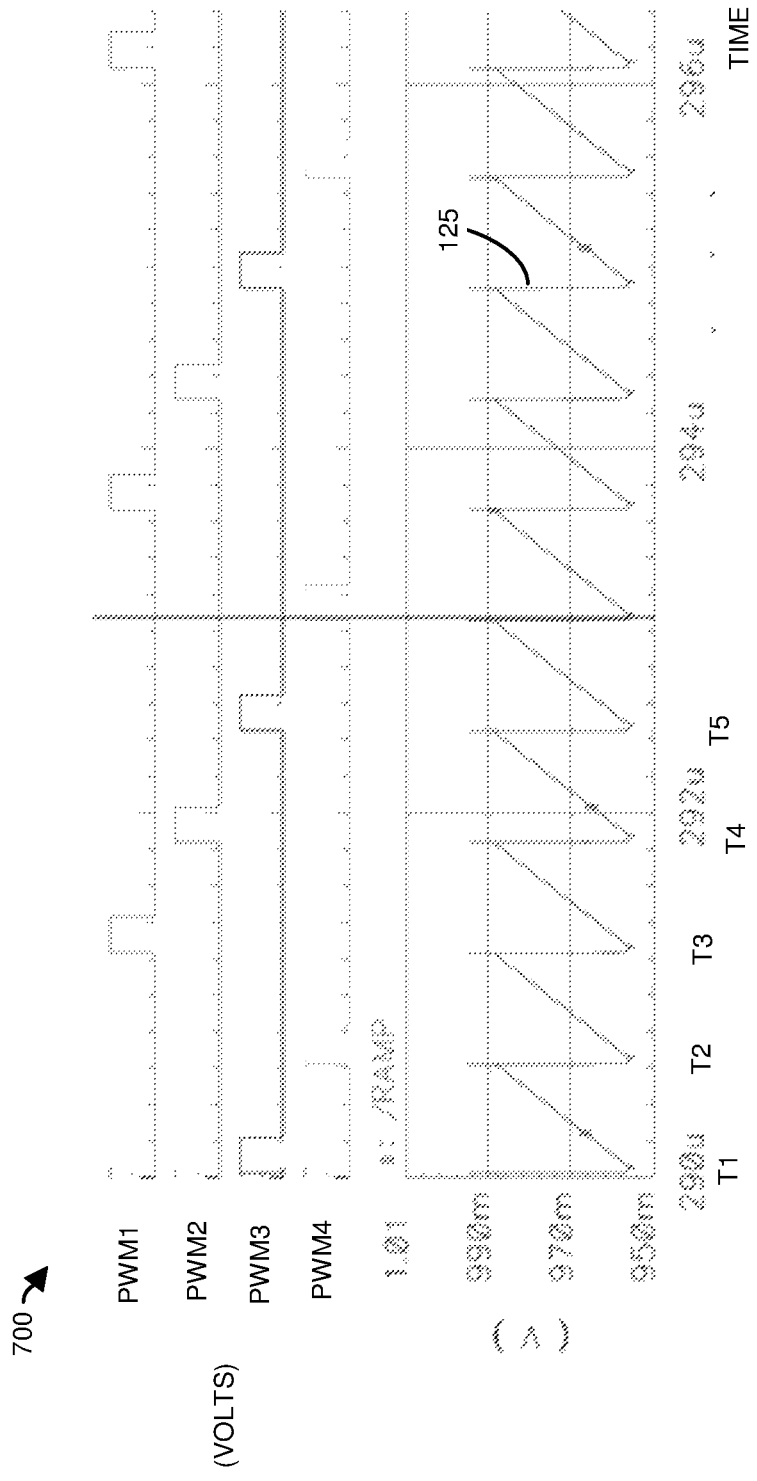
FIG. 7 is an example timing diagram illustrating generation of an offset adjusted ramp signal and generation of multiple pulse width modulation signals to control operation of multiple phases according to embodiments herein.

A timing diagram of the controller circuitry 140 controlling the multiple phases is further shown in FIG. 7.

FIG. 7 is an example timing diagram illustrating generation of an offset-adjusted ramp signal and multiple PWM control signals to control operation of multiple phases according to embodiments herein.

In a similar manner as previously discussed, the controller circuitry 140 includes ramp generator circuit 120. The phase control circuitry 160 compares the ramp voltage signal 125 to a magnitude of the output voltage feedback 192. The phase control circuitry 160 controls activation of the multiple phases in accordance with a sequential phase activation order including activation of phase 170-1, followed by activation of phase 170-2, followed by activation of phase 170-3, followed by activation of phase 170-4, followed by activation of phase 170-1, and so on.

More specifically, as shown in graph 700, at time T1, the phase control circuitry 160 detects that the magnitude of the ramp voltage signal 125 exceeds the output voltage feedback signal 192. In response this condition, at time T1, the phase control circuitry 160 generates control signal PW3 to activate the high side switch circuitry in phase 170-3 (while high side switch circuitry in the other phases are set to OFF states) for a predetermined amount of time. In addition to activating the high side switch circuitry associated with phase 170-3, the phase control circuitry 160 resets the magnitude of the ramp voltage signal 125 at or around time T1.

As the ramp voltage signal 125 ramps up after time T1, the phase control circuitry 160 again compares a magnitude of the ramp voltage signal 125 to a magnitude of the output voltage feedback signal 192. In response to detecting that the magnitude of the ramp voltage signal 125 crosses the magnitude of the output voltage feedback signal 192 at time T2, the phase control circuitry 160 generates control signal PW4 to activate respective high side switch circuitry in the phase 170-4 (while high side switch circuitry in the other phases are set to OFF states) for the predetermined amount of ON-time. In addition to activating the high side switch circuitry associated with phase 170-4, the phase control circuitry 160 resets the magnitude of the ramp voltage signal 125 at or around time T2.

As the ramp voltage signal 125 ramps up after time T2, the phase control circuitry 160 again compares a magnitude of the ramp voltage signal 125 to a magnitude of the output voltage feedback signal 192. In response to detecting that the magnitude of the ramp voltage signal 125 crosses the magnitude of the output voltage feedback signal 192 at time T3, the phase control circuitry 160 generates control signal PW1 to activate respective high side switch circuitry in the phase 170-1 (while high side switch circuitry in the other phases are set to OFF states) for the predetermined amount of ON-time. In addition to activating the high side switch circuitry associated with phase 170-1, the phase control circuitry 160 resets the magnitude of the ramp voltage signal 125 at or around time T3.

As the ramp voltage signal 125 ramps up after time T3, the phase control circuitry 160 again compares a magnitude of the ramp voltage signal 125 to a magnitude of the output voltage feedback signal 192. In response to detecting that the magnitude of the ramp voltage signal 125 crosses the magnitude of the output voltage feedback signal 192 at time T4, the phase control circuitry 160 generates control signal PW2 to activate respective high side switch circuitry in the phase 170-2 (while high side switch circuitry in the other phases are set to OFF states) for the predetermined amount of ON-time. In addition to activating the high side switch circuitry associated with phase 170-2, the phase control circuitry 160 resets the magnitude of the ramp voltage signal 125 at or around time T4.

As the ramp voltage signal 125 ramps up after time T4, the phase control circuitry 160 again compares a magnitude of the ramp voltage signal 125 to a magnitude of the output voltage feedback signal 192. In response to detecting that the magnitude of the ramp voltage signal 125 crosses the magnitude of the output voltage feedback signal 192 at time T5, the phase control circuitry 160 generates control signal PW3 to activate respective high side switch circuitry in the phase 170-3 (while high side switch circuitry in the other phases are set to OFF states) for the predetermined amount of ON-time. In addition to activating the high side switch circuitry associated with phase 170-3, the phase control circuitry 160 resets the magnitude of the ramp voltage signal 125 at or around time T5.

Figure 8:
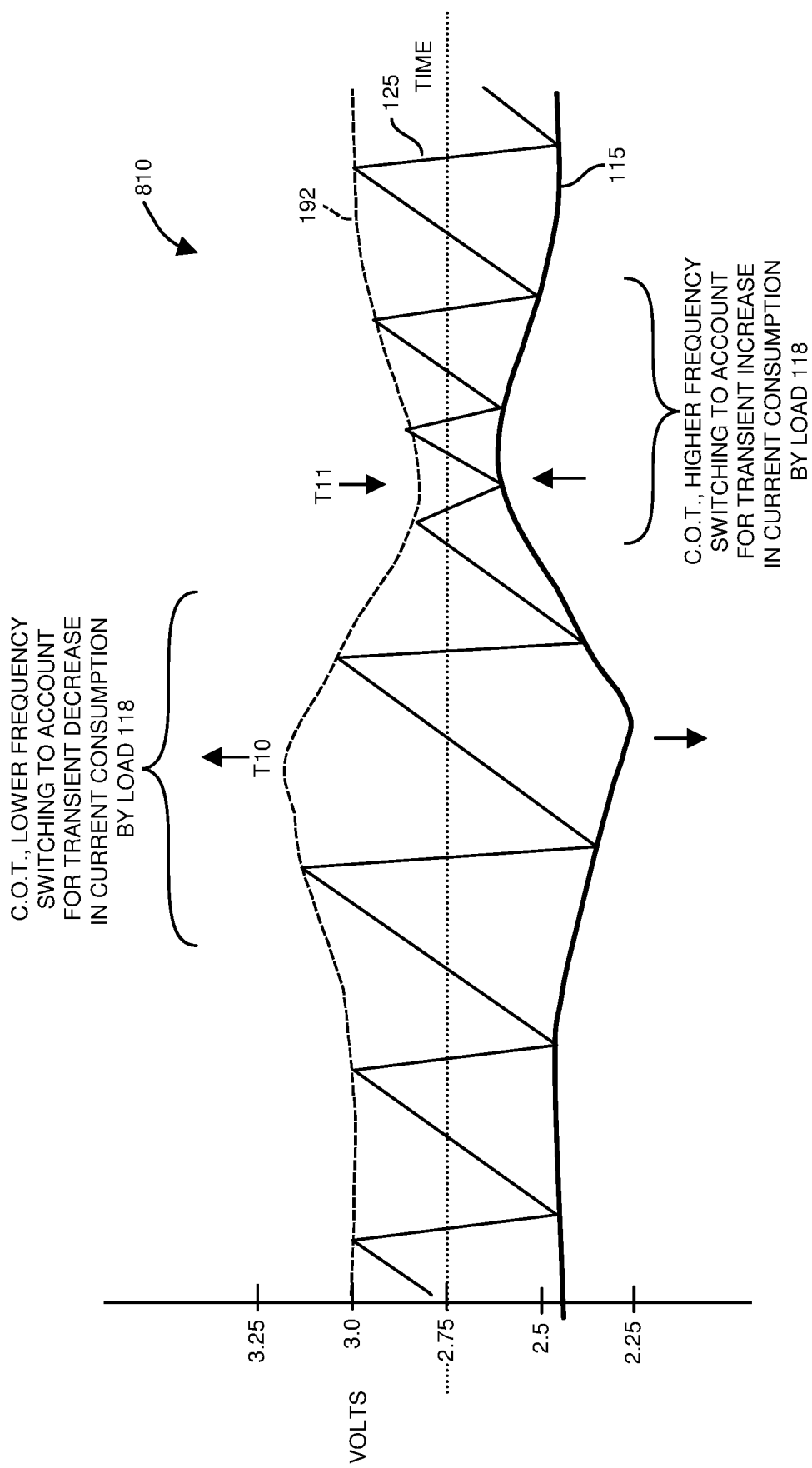
FIG. 8 is an example detailed timing diagram illustrating implementation of an offset-adjusted ramp voltage signal to control operation of a constant ON-time buck converter according to embodiments herein.

FIG. 8 is an example detailed timing diagram illustrating implementation of an offset-adjusted ramp voltage signal to control operation of a constant ON-time buck converter according to embodiments herein.

As shown, graph 810 illustrates the variation in frequency of operating a respective phase depending upon the comparison of the ramp voltage signal 125 and the output voltage feedback signal 192. As shown, the varying reference voltage 115 is a floor voltage to which a ramp voltage signal generated by the ramp generator circuit 120 is added. The ramp voltage signal 125 is therefore offset with respect to the floor voltage (such as varying reference voltage 115).

Assume that the steady-state of the output voltage feedback signal 192 is 3.0 V in this example embodiment. During conditions in which the load 118 experiences a sudden transient decrease in current consumption around time T10, the magnitude of the variable reference voltage 115 decreases. At approximately or around the same time, the magnitude of the output voltage feedback signal 192 increases due to the transient decrease in current consumption. In such an instance, because the magnitude of the variable reference voltage 115 decreases and the magnitude of the output voltage feedback signal 192 increases (envelope between the output voltage feedback signal 192 and the variable reference voltage 115 increases), it takes a longer amount of time for the ramp voltage signal 125 to cross the magnitude of the output voltage feedback signal 192 on each successive cycle, thus decreasing a switching frequency of activating a respective high side switch circuitry in the respective phase of the power supply 100. In other words, as mentioned, the control circuitry 140 activates a respective high side switch circuitry for a fixed amount of time and at a lower frequency during the transient decrease in current consumption by the load 118.

Conversely, during conditions in which the load 118 experiences a sudden transient increase in current consumption around time T11, the magnitude of the variable reference voltage 115 increases. At approximately the same time, the magnitude of the output voltage feedback signal 192 decreases due to the transient increase in current consumption. In such an instance, because the magnitude of the variable reference voltage 115 increases and the magnitude of the output voltage feedback signal 192 decreases (envelope between the output voltage feedback signal 192 and the variable reference voltage 115 decreases), it takes less time for the ramp voltage signal 125 to cross the magnitude of the output voltage feedback signal 192 on each successive cycle, thus increasing a switching frequency of activating a respective high side switch circuitry in the respective phase of the power supply 100. In other words, as mentioned, the control circuitry 140 activates respective high side switch circuitry for a fixed amount of time at a higher frequency during the transient increase in current consumption by the load 118.

Figure 9:
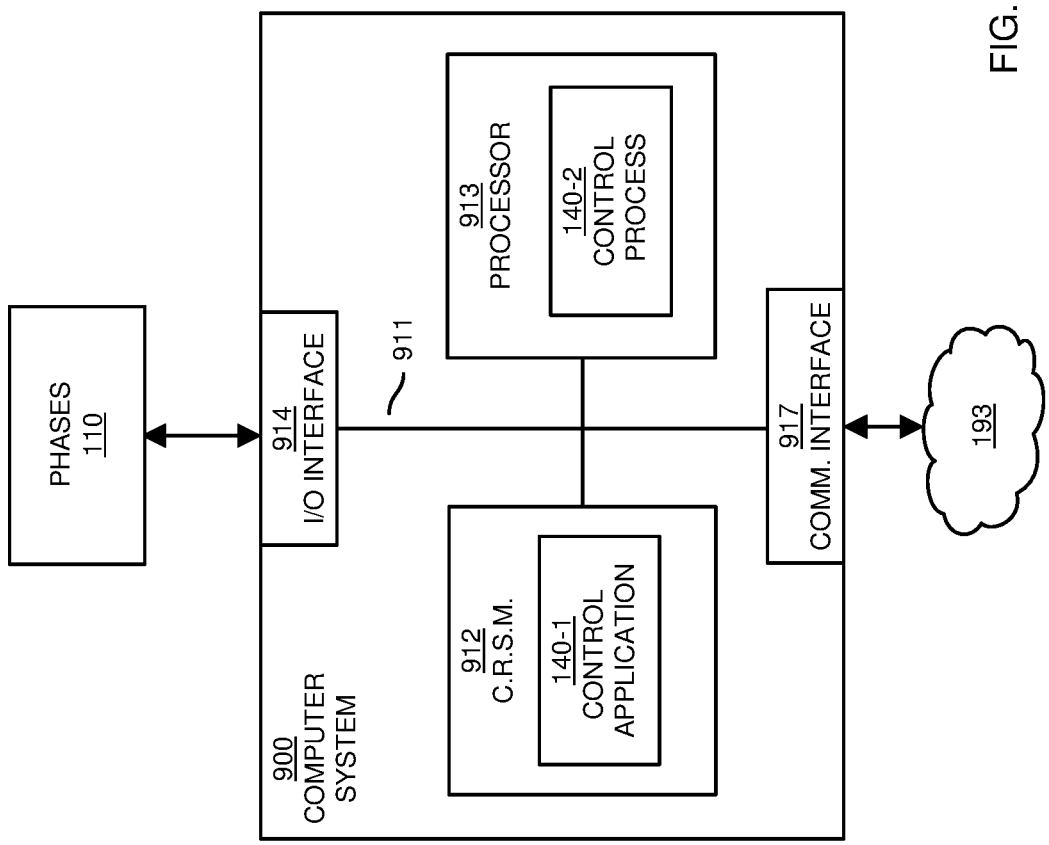
FIG. 9 is an example diagram illustrating computer processor hardware and related software instructions to execute methods according to embodiments herein.

FIG. 9 is an example block diagram of a computer device for implementing any of the operations as discussed herein according to embodiments herein.

As shown, computer system 900 (such as implemented by any resource such as controller circuitry 140, phase control circuitry 160, etc., of the present example includes an interconnect 911 that couples computer readable storage media 912 such as a non-transitory type of media (i.e., any type of hardware storage medium) in which digital information can be stored and retrieved, a processor 913 (e.g., computer processor hardware such as one or more processor devices), I/O interface 914, and a communications interface 919.

I/O interface 914 provides connectivity to any suitable circuitry such as each of phases 110.

Computer readable storage medium 912 can be any hardware storage resource or device such as memory, optical storage, hard drive, floppy disk, etc. In one embodiment, the computer readable storage medium 912 stores instructions and/or data used by the control application 140-1 to perform any of the operations as described herein.

Further in this example embodiment, communications interface 918 enables the computer system 900 and processor 913 to communicate over a resource such as network 193 to retrieve information from remote sources and communicate with other computers.

As shown, computer readable storage media 912 is encoded with control application 140-1 (e.g., software, firmware, etc.) executed by processor 913. Control application 140-1 can be configured to include instructions to implement any of the operations as discussed herein.

During operation of one embodiment, processor 913 accesses computer readable storage media 912 via the use of interconnect 911 in order to launch, run, execute, interpret or otherwise perform the instructions in control application 140-1 stored on computer readable storage medium 912.

Execution of the control application 140-1 produces processing functionality such as control process 140-2 in processor 913. In other words, the control process 140-2 associated with processor 913 represents one or more aspects of executing control application 140-1 within or upon the processor 913 in the computer system 900.

In accordance with different embodiments, note that computer system may be a micro-controller device configured to control a power supply and perform any of the operations as described herein.

Functionality supported by the different resources will now be discussed via flowcharts in FIG. 10. Note that the steps in the flowcharts below can be executed in any suitable order.

FIG. 10 is a flowchart 1000 illustrating an example method according to embodiments herein. Note that there will be some overlap with respect to concepts as discussed above.

In processing operation 1010, the reference voltage generator circuit 110 receives output voltage feedback signal 192.

In processing operation 1020, the reference voltage generator circuit 110 receives reference voltage 105.

In processing operation 1030, the reference voltage generator circuit 110 compares a magnitude of the output voltage feedback signal 192 to the received reference voltage 105.

In processing operation 1040, based on the comparison, the reference voltage generator circuit 110 produces varying reference voltage 115.

In processing operation 1050, the ramp generator circuit 120 produces a ramp voltage signal 125, a magnitude of which is offset by the varying reference voltage 115.

In processing operation 1060, the compare circuitry 150 compares a magnitude of the ramp voltage signal 125 to a magnitude of the output voltage feedback signal 192. In processing operation 1070, based at least in part on results of a comparison of the ramp voltage signal 125 and the output voltage feedback signal 192 of the power supply 100, the phase control circuitry 160 controls activation of power supply phase circuitry 170 to power dynamic load 118.

Note again that techniques herein are well suited for use in power converter circuit applications such as those that include multiple phases, multiple DC-DC power converter circuits, semi-resonant DC-DC phases, buck converters, etc. However, it should be noted that embodiments herein are not limited to use in such applications and that the techniques discussed herein are well suited for other applications as well.

Based on the description set forth herein, numerous specific details have been set forth to provide a thorough understanding of claimed subject matter. However, it will be understood by those skilled in the art that claimed subject matter may be practiced without these specific details. In other instances, methods, apparatuses, systems, etc., that would be known by one of ordinary skill have not been described in detail so as not to obscure claimed subject matter. Some portions of the detailed description have been presented in terms of algorithms or symbolic representations of operations on data bits or binary digital signals stored within a computing system memory, such as a computer memory. These algorithmic descriptions or representations are examples of techniques used by those of ordinary skill in the data processing arts to convey the substance of their work to others skilled in the art. An algorithm as described herein, and generally, is considered to be a self-consistent sequence of operations or similar processing leading to a desired result. In this context, operations or processing involve physical manipulation of physical quantities. Typically, although not necessarily, such quantities may take the form of electrical or magnetic signals capable of being stored, transferred, combined, compared or otherwise manipulated. It has been convenient at times, principally for reasons of common usage, to refer to such signals as bits, data, values, elements, symbols, characters, terms, numbers, numerals or the like. It should be understood, however, that all of these and similar terms are to be associated with appropriate physical quantities and are merely convenient labels. Unless specifically stated otherwise, as apparent from the following discussion, it is appreciated that throughout this specification discussions utilizing terms such as "processing," "computing," "calculating," "determining" or the like refer to actions or processes of a computing platform, such as a computer or a similar electronic computing device, that manipulates or transforms data represented as physical electronic or magnetic quantities within memories, registers, or other information storage devices, transmission devices, or display devices of the computing platform.

FURTHER PERMUTATIONS OF EMBODIMENTS

Clause 1. A power supply including a power converter circuit operated in a constant ON-time control mode, the power supply comprising:
a reference voltage generator circuit to produce a varying reference voltage;
a ramp generator circuit to produce a ramp voltage signal, a magnitude of which is offset by the varying reference voltage; and
a control circuit to control activation of the power converter circuit to generate an output voltage to power a load based on a magnitude of the ramp voltage signal with respect to an output voltage feedback signal of the power supply.

Clause 2. The power supply as in any of clauses 1-14, wherein the output voltage feedback signal is derived from the output voltage generated by the power converter circuit.

Clause 3. The power supply as in any of clauses 1-14, wherein the reference voltage generator circuit receives a reference voltage as input; and
wherein a magnitude of the output voltage feedback signal with respect to the reference voltage inputted to the reference voltage generator circuit indicates a degree to which the respective output voltage of the power converter circuit is within regulation.

Clause 4. The power supply as in any of clauses 1-14, wherein the control circuit includes: a comparator circuit operable to reset a magnitude of the ramp voltage signal in response to detecting a condition in which the ramp voltage signal crosses the output voltage feedback signal.

Clause 5. The power supply as in any of clauses 1-14, wherein the reset of the ramp voltage signal resets the magnitude of the ramp voltage signal to be substantially equal to a current magnitude of the varying reference voltage; and
wherein, subsequent to the reset, the ramp generator circuit ramps the ramp voltage signal again with respect to the varying reference voltage.

Clause 6. The power supply as any of clauses 1-14, wherein the control circuit is operable to activate a high side switch in the power converter circuit in response to detecting a condition in which the ramp voltage signal crosses the output voltage feedback signal, the activation of the high side switch increasing a magnitude of the output voltage feedback signal.

Clause 7. The power supply as any of clauses 1-14, wherein the reference voltage generator circuit is operable to increase a magnitude of the varying reference voltage produced by the reference voltage generator circuit during transient conditions in which the load powered by the power converter circuit increases a rate of consuming current provided by the power converter circuit.

Clause 8. The power supply as in any of clauses 1-14, wherein the reference voltage generator circuit is operable to decrease a magnitude of the varying reference voltage produced by the reference voltage generator circuit during transient conditions in which the load powered by the power converter circuit decreases a rate of consuming current by the power converter circuit.

Clause 9. The power supply as in any of clauses 1-14, wherein the reference voltage generator circuit further includes a bias circuit to bias the varying reference voltage towards a bias voltage value over time.

Clause 10. The power supply as in any of clauses 1-14, wherein the reference voltage generator circuit varies a magnitude of the offset voltage with respect to the bias voltage value depending on a difference between the output voltage feedback signal and a reference voltage setpoint inputted to the reference voltage generator circuit.

Clause 11. The power supply as in any of clauses 1-14, wherein the reference voltage generator circuit includes a transconductance amplifier to compare a magnitude of the output voltage feedback signal to a received reference voltage, the transconductance amplifier operable to generate an output current, a magnitude of which depends on a difference between the magnitude of the output voltage feedback signal and the received reference voltage.

Clause 12. The power supply as in any of clauses 1-14, wherein the reference voltage generator circuit further includes a capacitor, the capacitor operable to receive the output current generated by the transconductance amplifier to produce the varying reference voltage.

Clause 13. The power supply as in any of clauses 1-14, wherein the reference voltage generator circuit further includes a bias circuit to bias the varying reference voltage towards a bias voltage value.

Clause 14. The power supply as in any of clauses 1-14, wherein the ramp voltage emulates a ripple voltage present on an output voltage generated by the power converter circuit to power the load.

Clause 15. A method of controlling a power converter circuit of a power supply, the power converter circuit operated in a constant ON-time control mode to produce a respective output voltage to power a load, the method comprising:
producing a varying reference voltage based on an output voltage feedback signal of the power supply;
producing a ramp voltage signal, a magnitude of which is offset by the varying reference voltage; and
controlling activation of the power converter circuit to power the load based on a comparison of the ramp voltage signal and the output voltage feedback signal of the power supply.

Clause 16. The method as in any of clauses 15-28 further comprising:
deriving the output voltage feedback signal from the respective output voltage generated by the power converter circuit.

Clause 17. The method as in any of clauses 15-28, wherein a magnitude of the output voltage feedback signal with respect to a received reference voltage indicates a degree to which the respective output voltage is within regulation.

Clause 18. The method as in clause 15 further comprising:
resetting a magnitude of the ramp voltage in response to a condition in which the ramp voltage signal crosses the output voltage feedback signal.

Clause 19. The method as in any of clauses 15-28, wherein resetting of the ramp voltage signal resets the magnitude of the ramp voltage signal to be substantially equal to a current magnitude of the varying reference voltage, the method further comprising:
subsequent to the reset, ramping the ramp voltage signal again.

Clause 20. The method as in any of clauses 15-28 further comprising:
activating a high side switch in the power converter circuit in response to a condition in which a magnitude of the ramp voltage signal crosses the output voltage feedback signal, the activation of the high side switch increasing a magnitude of the output voltage feedback signal.

Clause 21. The method as in any of clauses 15-28 further comprising:
increasing a magnitude of the varying reference voltage in response to a transient condition in which the load powered by the power converter circuit increases a rate of consuming current provided by the power converter circuit.

Clause 22. The method as in any of clauses 15-28 further comprising:
decreasing a magnitude of the varying reference voltage in response to a transient condition in which the load powered by the power converter circuit decreases a rate of consuming current by the power converter circuit.

Clause 23. The method as in any of clauses 15-28 further comprising:
biasing the varying reference voltage towards a bias voltage value over time.

Clause 24. The method as in any of clauses 15-28 further comprising:
varying a magnitude of the offset voltage with respect to the bias voltage value depending on a difference between the output voltage feedback signal and a reference voltage setpoint.

Clause 25. The method as in any of clauses 15-28 further comprising:
comparing a magnitude of the output voltage feedback signal to a received reference voltage; and
generating an output current, a magnitude of which depends on a difference between the magnitude of the output voltage feedback signal and the received reference voltage.

Clause 26. The method as in any of clauses 15-28 further comprising:
using the output current generated by the transconductance amplifier to produce the varying reference voltage.

Clause 27. The method as in any of clauses 15-28 further comprising:
controlling delivery of a bias current to bias the varying reference voltage towards a bias voltage value.

Clause 28. The method as in any of clauses 15-28, wherein the ramp voltage signal emulates a ripple voltage present on an output voltage generated by the power converter circuit to power the load.

While this invention has been particularly shown and described with references to preferred embodiments thereof, it will be understood by those skilled in the art that various changes in form and details may be made therein without departing from the spirit and scope of the present application as defined by the appended claims. Such variations are intended to be covered by the scope of this present application. As such, the foregoing description of embodiments of the present application is not intended to be limiting. Rather, any limitations to the invention are presented in the following claims.

We claim:

1. A power supply comprising:
a reference voltage generator operable to produce a varying reference voltage;
a ramp generator operable to produce a ramp voltage signal, a magnitude of which is offset by the varying reference voltage; and
a controller operable to control activation of a power converter, the power converter operable to generate an output voltage to power a load based on a magnitude of the ramp voltage signal with respect to an output voltage feedback signal of the power supply;
wherein the controller includes: a comparator operable to reset a magnitude of the ramp voltage signal in response to detecting a condition in which the ramp voltage signal offset by the varying reference voltage crosses the output voltage feedback signal.

2. The power supply as in claim 1, wherein the varying reference voltage is a floor voltage; and
wherein the ramp voltage signal offset by the varying reference voltage is a summation of the ramp voltage signal and the floor voltage.

3. The power supply as in claim 1, wherein the reset of the ramp voltage signal resets the magnitude of the ramp voltage signal offset by the varying reference voltage to be substantially equal to the varying reference voltage.

4. The power supply as in claim 1, wherein the output voltage feedback signal is derived from the output voltage generated by the power converter.

5. The power supply as in claim 4, wherein the reference voltage generator receives a reference voltage as input; and
wherein a magnitude of the output voltage feedback signal with respect to the reference voltage inputted to the reference voltage generator indicates a degree to which the respective output voltage of the power converter is within regulation.

6. The power supply as in claim 1, wherein the reference voltage generator further includes a bias circuit operable to bias the varying reference voltage towards a bias voltage value over time.

7. The power supply as in claim 1, wherein the reference voltage generator includes a transconductance amplifier operable to compare a magnitude of the output voltage feedback signal to a received reference voltage, the transconductance amplifier further operable to generate an output current, a magnitude of which depends on a difference between the magnitude of the output voltage feedback signal and the received reference voltage.

8. The power supply as in claim 7, wherein the reference voltage generator further includes a capacitor, the capacitor operable to receive the output current generated by the transconductance amplifier to produce the varying reference voltage.

9. The power supply as in claim 8, wherein the reference voltage generator further includes a bias circuit operable to bias the varying reference voltage towards a bias voltage value.

10. The power supply as in claim 1, wherein the controller is operable to activate a high side switch in the power converter in response to detecting a condition in which the ramp voltage signal crosses the output voltage feedback signal, the activation of the high side switch increasing a magnitude of the output voltage feedback signal.

11. The power supply as in claim 1, wherein the controller is operable to compare a magnitude of the ramp voltage signal to the output voltage feedback signal to control activation of the power converter.

12. The power supply as in claim 1, wherein a magnitude of the output voltage feedback signal varies depending on the output voltage generated by the power converter.

13. The power supply as in claim 1, wherein the reference voltage generator receives a reference voltage as input, the reference voltage used by the reference voltage generator to generate the varying reference voltage; and
   wherein a magnitude of the output voltage feedback signal with respect to the reference voltage indicates a degree to which the respective output voltage of the power converter is within regulation.

14. The power supply as in claim 1, wherein a magnitude of the varying reference voltage varies depending on an amount of current consumed by the load.

15. The power supply as in claim 1, wherein the controller is further operable to vary a magnitude of the varying reference voltage depending on a magnitude of current provided by the output voltage to the load.

16. The power supply as in claim 1 further comprising:
   switches controlled by the controller, the switches operable to convert an input voltage into the output voltage; and
   wherein changes in a magnitude of the varying reference voltage results in an adjustment to a frequency of switching the switches ON and OFF.

17. The power supply as in claim 1, wherein the controller is further operable to vary a magnitude of the varying reference voltage depending on a magnitude of the output voltage.

18. The power supply as in claim 1, wherein variations in a magnitude of the varying reference voltage controls an amount of power delivered by the output voltage to the load.

19. A method of controlling a power converter of a power supply, the power converter operated to produce a respective output voltage to power a load, the method comprising:
   producing a varying reference voltage based on an output voltage feedback signal of the power supply;
   producing a ramp voltage signal, a magnitude of which is offset by the varying reference voltage; and
   controlling activation of the power converter to power the load based on a comparison of the ramp voltage signal and the output voltage feedback signal of the power supply, the method further comprising:
   resetting a magnitude of the ramp voltage signal in response to a condition in which the ramp voltage signal crosses the output voltage feedback signal.

20. The method as in claim 19 further comprising:
   deriving the output voltage feedback signal from the respective output voltage generated by the power converter.

21. The method as in claim 20, wherein a magnitude of the output voltage feedback signal with respect to a received reference voltage indicates a degree to which the respective output voltage is within regulation.

22. The method as in claim 19, wherein resetting of the ramp voltage signal resets the magnitude of the ramp voltage signal offset by the varying reference voltage to be substantially equal to of the varying reference voltage.

23. The method as in claim 19 further comprising:
   activating a high side switch in the power converter in response to a condition in which a magnitude of the ramp voltage signal crosses the output voltage feedback signal, the activation of the high side switch increasing a magnitude of the output voltage feedback signal.

24. The method as in claim 19 further comprising:
   comparing a magnitude of the output voltage feedback signal to a received reference voltage; and
   generating an output current, a magnitude of which depends on a difference between the magnitude of the output voltage feedback signal and the received reference voltage.

25. The method as in claim 24 further comprising:
   controlling delivery of a bias current to bias the varying reference voltage towards a bias voltage value.

26. A power supply comprising:
   a reference voltage generator operable to produce a varying reference voltage;
   a ramp generator operable to produce a ramp voltage signal, a magnitude of which is offset by the varying reference voltage;
   a controller operable to control activation of a power converter, the power converter operable to generate an output voltage to power a load based on a magnitude of the ramp voltage signal with respect to an output voltage feedback signal of the power supply; and
   wherein the reference voltage generator is operable to increase a magnitude of the varying reference voltage produced by the reference voltage generator during transient conditions in which the load powered by the power converter increases a rate of consuming current provided by the power converter.

27. A power supply comprising:
   a reference voltage generator operable to produce a varying reference voltage;
   a ramp generator operable to produce a ramp voltage signal, a magnitude of which is offset by the varying reference voltage; and
   a controller operable to control activation of a power converter, the power converter operable to generate an output voltage to power a load based on a magnitude of the ramp voltage signal with respect to an output voltage feedback signal of the power supply;
   wherein the reference voltage generator is operable to decrease a magnitude of the varying reference voltage produced by the reference voltage generator during transient conditions in which the load powered by the power converter decreases a rate of consuming current by the power converter.

28. A power supply comprising:
   a reference voltage generator operable to produce a varying reference voltage;
   a ramp generator operable to produce a ramp voltage signal, a magnitude of which is offset by the varying reference voltage; and
   a controller operable to control activation of a power converter, the power converter operable to generate an output voltage to power a load based on a magnitude of the ramp voltage signal with respect to an output voltage feedback signal of the power supply;
   wherein the reference voltage generator further includes a bias circuit operable to bias the varying reference voltage towards a bias voltage value over time; and
   wherein the reference voltage generator varies a magnitude of the offset with respect to the bias voltage value depending on a difference between the output voltage feedback signal and a reference voltage setpoint inputted to the reference voltage generator.

29. A method of controlling a power converter of a power supply, the power converter operated to produce a respective output voltage to power a load, the method comprising:
producing a varying reference voltage based on an output voltage feedback signal of the power supply;
producing a ramp voltage signal, a magnitude of which is offset by the varying reference voltage; and
controlling activation of the power converter to power the load based on a comparison of the ramp voltage signal and the output voltage feedback signal of the power supply, the method further comprising:
increasing a magnitude of the varying reference voltage in response to a transient condition in which the load powered by the power converter increases a rate of consuming current provided by the power converter.

30. A method of controlling a power converter of a power supply, the power converter operated to produce a respective output voltage to power a load, the method comprising:
producing a varying reference voltage based on an output voltage feedback signal of the power supply;
producing a ramp voltage signal, a magnitude of which is offset by the varying reference voltage; and
controlling activation of the power converter to power the load based on a comparison of the ramp voltage signal and the output voltage feedback signal of the power supply, the method further comprising:
decreasing a magnitude of the varying reference voltage in response to a transient condition in which the load powered by the power converter decreases a rate of consuming current by the power converter.

31. A method of controlling a power converter of a power supply, the power converter operated to produce a respective output voltage to power a load, the method comprising:
producing a varying reference voltage based on an output voltage feedback signal of the power supply;
producing a ramp voltage signal, a magnitude of which is offset by the varying reference voltage; and
controlling activation of the power converter to power the load based on a comparison of the ramp voltage signal and the output voltage feedback signal of the power supply, the method further comprising:
varying a magnitude of the offset with respect to a bias voltage value depending on a difference between the output voltage feedback signal and a reference voltage setpoint.

32. A power supply comprising:
a reference voltage generator operable to produce a varying reference voltage;
a ramp generator operable to produce a ramp voltage signal, a magnitude of which is offset by the varying reference voltage;
a controller operable to control activation of a power converter, the power converter operable to generate an output voltage to power a load based on a magnitude of the ramp voltage signal with respect to an output voltage feedback signal of the power supply;
wherein the controller is operable to reset the magnitude of the ramp voltage signal to be substantially equal to a current magnitude of the varying reference voltage; and
wherein, subsequent to the reset of the ramp voltage signal, the ramp generator is operable to ramp the ramp voltage signal again with respect to the varying reference voltage.

33. A power supply comprising:
a reference voltage generator operable to produce a varying reference voltage;
a ramp generator operable to produce a ramp voltage signal, a magnitude of which is offset by the varying reference voltage;
a controller operable to control activation of a power converter, the power converter operable to generate an output voltage to power a load based on a magnitude of the ramp voltage signal with respect to an output voltage feedback signal of the power supply;
wherein the controller is further operable to vary a magnitude of the varying reference voltage depending on a magnitude of the output voltage;
wherein the controller is further operable to increase a magnitude of the varying reference voltage in response to detecting a decrease in a magnitude of the output voltage; and
wherein the controller is further operable to decrease a magnitude of the varying reference voltage in response to detecting an increase in the magnitude of the output voltage.

* * * * *